(12) United States Patent
Takamatsu et al.

(10) Patent No.: US 9,848,501 B2
(45) Date of Patent: Dec. 19, 2017

(54) ELECTRONIC CONTROL DEVICE

(71) Applicant: AISIN AW CO., LTD., Anjo-shi, Aichi-ken (JP)

(72) Inventors: Jun Takamatsu, Nishio (JP); Naotaka Murakami, Anjo (JP); Hitoshi Tomita, Nishio (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 15/128,789

(22) PCT Filed: Apr. 9, 2015

(86) PCT No.: PCT/JP2015/061170
§ 371 (c)(1),
(2) Date: Sep. 23, 2016

(87) PCT Pub. No.: WO2015/156370
PCT Pub. Date: Oct. 15, 2015

(65) Prior Publication Data
US 2017/0112004 A1 Apr. 20, 2017

(30) Foreign Application Priority Data
Apr. 11, 2014 (JP) .................................. 2014-081546

(51) Int. Cl.
*H05K 5/00* (2006.01)
*H01R 12/72* (2011.01)
*H01R 13/52* (2006.01)

(52) U.S. Cl.
CPC ......... *H05K 5/0052* (2013.01); *H01R 12/722* (2013.01); *H01R 13/5202* (2013.01); *H01R 2201/26* (2013.01)

(58) Field of Classification Search
CPC ............ H01R 2201/26; H01R 13/5202; H01R 12/722; H05K 5/0052
USPC .................................. 361/728–730, 752, 796
See application file for complete search history.

(56) References Cited

U.S. PATENT DOCUMENTS

| | | |
|---|---|---|
| 8,942,001 B2 | 1/2015 | Kawai et al. |
| 2002/0112870 A1 | 8/2002 | Kobayashi et al. |
| 2009/0237896 A1 | 9/2009 | Yamauchi |
| 2011/0235289 A1 | 9/2011 | Watanabe et al. |
| 2014/0085839 A1 | 3/2014 | Nakano et al. |

FOREIGN PATENT DOCUMENTS

| | | |
|---|---|---|
| JP | 2001-085858 A | 3/2001 |
| JP | 2009-230925 A | 10/2009 |
| JP | 2011-201348 A | 10/2011 |
| JP | 2012-209508 A | 10/2012 |
| JP | 2013-069735 A | 4/2013 |
| JP | 2014-061821 A | 4/2014 |

OTHER PUBLICATIONS

Jul. 14, 2015 Search Report issued in International Patent Application No. PCT/JP2015/061170.

*Primary Examiner* — Hung S Bui
(74) *Attorney, Agent, or Firm* — Oliff PLC

(57) ABSTRACT

An electronic control device that includes a housing having a first opening and a second opening; a cover; and a connector electrically connected to a substrate disposed inside the housing, wherein a clearance between the housing-side inner wall and the connector-side inner wall and a clearance between the housing-side outer wall and the connector-side outer wall differ from each other in position in a direction in which the first groove extends.

10 Claims, 10 Drawing Sheets

ELECTRONIC CONTROL DEVICE

BACKGROUND

The present disclosure relates to an electronic control device for an engine, an automatic speed change mechanism, or the like mounted on a vehicle, and in particular to a configuration that has a connector connected to a substrate disposed in a space surrounded by a housing and a cover and disposed between the housing and the cover so as to be partially exposed to the outside of the space.

An electronic control device (ECU) for an engine, an automatic speed change mechanism, or the like mounted on a vehicle can be electrically connected to a variety of devices via a connector with an electronic component such as a substrate disposed in a space surrounded by a housing and a cover and with the connector connected to the substrate and exposed to the outside of the space. In such an electronic control device, a seal material is filled into each joint portion among the housing, the cover, and the connector to tightly seal the space in which the electronic component is disposed.

For example, a groove is formed in one of components of each joint portion, a projecting streak formed on the other of the components is inserted into the groove, and a seal material is filled between the groove and the projecting streak to tightly seal the space discussed above. In such a configuration, a joint portion formed by only the seal material is formed at an intersecting portion at which joint portions among the housing, the cover, and the connector intersect each other. The joint portion formed by only the seal material is low in rigidity as a seal compared to other portions, and therefore tends to be low in sealing performance.

Therefore, there is proposed a configuration in which a groove is formed in a housing (case) and a connector and a projecting streak formed on a cover is inserted into the groove, structured such that an auxiliary groove is further formed in a part of the groove of the connector to obtain a stepped groove shape and an auxiliary projecting streak that can be inserted into the auxiliary groove is formed on a part of the projecting streak of the cover to eliminate a joint portion formed by only the seal material as discussed above (Japanese Patent Application Publication No. 2013-69735).

SUMMARY

In the case of the structure described in Japanese Patent Application Publication No. 2013-69735, however, an increase in dimension of the connector and the housing in the width direction of the groove is unavoidable because of the formation of the auxiliary groove. Since the electronic control device is mounted on a vehicle or the like, however, it is desirable to make the electronic control device compact.

Thus, there is provided an electronic control device that eliminates a joint portion formed by only a seal material and that can be made compact.

The present disclosure provides an electronic control device that includes: a housing having a first opening and a second opening; a cover; and a connector electrically connected to a substrate disposed inside the housing, wherein: a first joint of the housing and a second joint of the connector are joined to each other in the first opening; a first groove is formed around the second opening and in a surface of the connector on a side toward the cover, a first projecting streak provided at a peripheral edge of the cover is inserted into the first groove, and the cover is joined to the housing and the connector so as to cover a space surrounded by the housing and the connector; the first groove has a first inner wall composed of a housing-side inner wall formed on the housing on a side of the space and a connector-side inner wall formed on the connector on the side of the space, and a first outer wall composed of a housing-side outer wall formed on the housing on an outer side and a connector-side outer wall formed on the connector on the outer side; and a clearance between the housing-side inner wall and the connector-side inner wall and a clearance between the housing-side outer wall and the connector-side outer wall differ from each other in position in a direction in which the first groove extends.

With the electronic control device according to the present disclosure, the clearance between the housing-side inner wall and the connector-side inner wall and the clearance between the housing-side outer wall and the connector-side outer wall differ in position in the direction in which the first groove extends. Therefore, a joint formed by only the seal material can be eliminated, and the structure can be made compact with the dimension in the width direction of the groove not increased.

DETAILED DESCRIPTION OF EMBODIMENTS

An embodiment according to the present disclosure will be described below with reference to FIGS. 1 to 9. First, the configuration of an electronic control device (ECU) 1 according to the embodiment will be described with reference to FIG. 1.

Figure 1A:
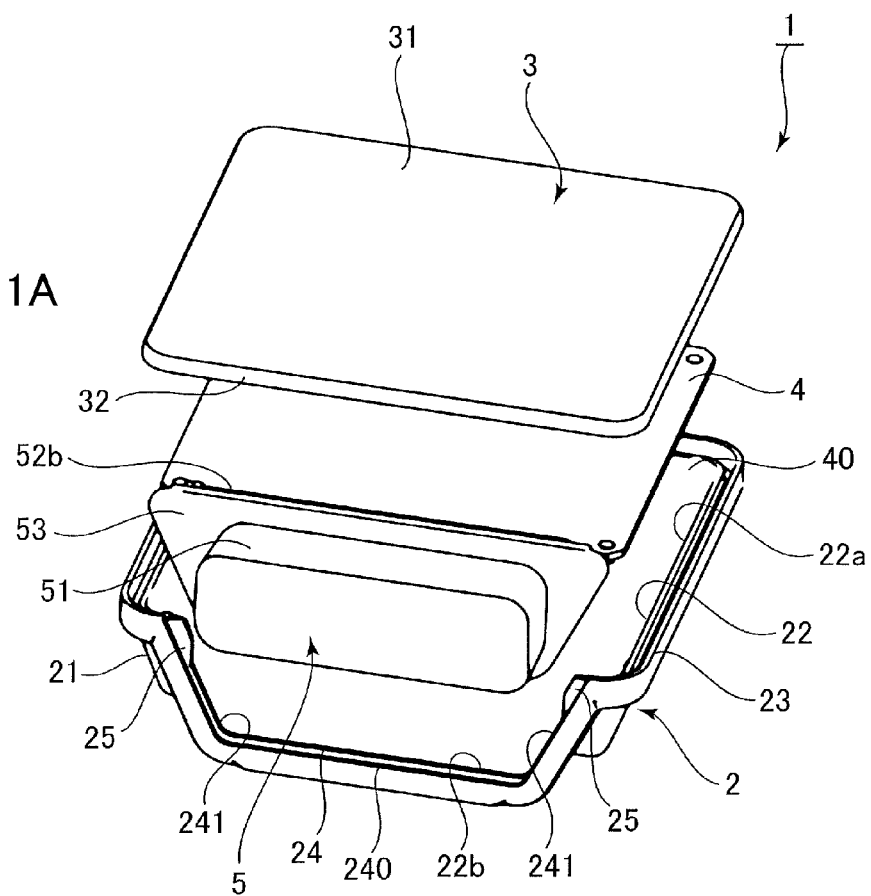
FIGS. 1A and 1B are an exploded perspective view and a perspective view, respectively, of an electronic control device according to an embodiment.

The electronic control device 1 is disposed inside a vehicle, and controls an engine, an automatic speed change mechanism, or the like mounted on the vehicle. To this end, as illustrated in FIG. 1A, the electronic control device 1 includes a housing 2, a cover 3, and a connector 5 connected to a substrate 4. The housing 2 is made of die-cast aluminum which is a cast aluminum alloy, for example, is formed in the shape of a box with a generally trapezoidal section, and has a body portion 21 in which electronic components such as the substrate 4 are disposed, and an opening portion 22 composed of a body opening portion 22a (second opening portion/second opening) and a side opening portion 22b (first opening portion/first opening). Housing-side grooves 23 and 24 are formed around the opening portion 22. The shape of the housing-side grooves 23 and 24 will be discussed in detail later. The body opening portion 22a has a size that enables the electronic components such as the substrate 4 to pass therethrough. The side opening portion 22b is open in a side of the body portion 21 in a continuous manner with the body opening portion 22a. A housing-side groove 23, which constitutes a first groove 300 (see FIG. 3 etc.) together with a connector-side groove 52b to be discussed later, is formed around the body opening portion 22a, and a housing-side groove 24, which serves as a first joint portion/first joint (second groove), is formed around the side opening portion 22b, with the housing-side grooves 23 and 24 being continuous with each other. The connector 5 to be discussed later can be inserted into the side opening portion 22b.

The cover 3 is formed by pressing a plate material made of a metal such as an aluminum alloy, for example, and has a covering portion 31 that covers the opening portion 22 of the housing 2, and a cover-side projecting streak 32 formed at the peripheral edge of the covering portion 31 to serve as a first projecting streak. In the embodiment, the covering portion 31 has a flat plate shape. However, the covering portion 31 may be formed to have recesses and projections depending on the shape of the housing 2 and the shape of the electronic components disposed inside the housing 2. The cover-side projecting streak 32 is formed to be able to be joined to the housing-side groove 23, which is formed around the body opening portion 22a of the housing 2, and the connector-side groove 52b, which is formed in the connector 5 to be discussed next. The shape of the cover-side projecting streak 32 will also be discussed in detail later.

A circuit pattern is formed on a surface of the substrate 4. Electronic components such as capacitors and coils are mounted to the substrate 4. The substrate 4 is disposed in a space 40 surrounded by the housing 2 and the cover 3. The connector 5 is electrically connected to the substrate 4, and has an exterior portion 51 made of a synthetic resin and provided so as to cover a terminal that can be connected to a variety of devices, a connector-side projecting streak 52a (see FIG. 5) formed around the exterior portion 51 at a position facing the side opening portion 22b to serve as a second joint portion/second joint (second projecting streak), and the connector-side groove 52b which is formed in a surface of the connector 5 on the side toward the cover 3. The connector-side projecting streak 52a and the connector-side groove 52b can be joined to the housing-side groove 24, which is formed around the side opening portion 22b of the housing 2, and the cover-side projecting streak 32 of the cover 3, respectively. The connector-side groove 52b is continuous with the housing-side groove 23, which is formed around the body opening portion 22a of the housing 2, with the connector 5 joined to the housing 2 to constitute the first groove 300 into which the cover-side projecting streak 32 (first projecting streak) of the cover 3 is to be inserted. That is, the housing-side groove 23 and the connector-side groove 52b constitute a circulating groove, into which the cover-side projecting streak 32 is to be inserted.

The exterior portion 51 is disposed such that a part of the exterior portion 51 on the opposite side of the substrate 4 from the connector-side projecting streak 52a and the connector-side groove 52b is exposed to the outside of the space 40. The exterior portion 51 is fixed to the substrate 4 with a base portion of the exterior portion 51, which is on the substrate 4 side from the connector-side projecting streak 52a and the connector-side groove 52b, disposed in the space 40. In addition, an outside wall portion 53 is formed around the exterior portion 51 outward of the connector-side projecting streak 52a and the connector-side groove 52b. The shape of the connector-side projecting streak 52a and the connector-side groove 52b will also be discussed in detail later.

Figure 1B:
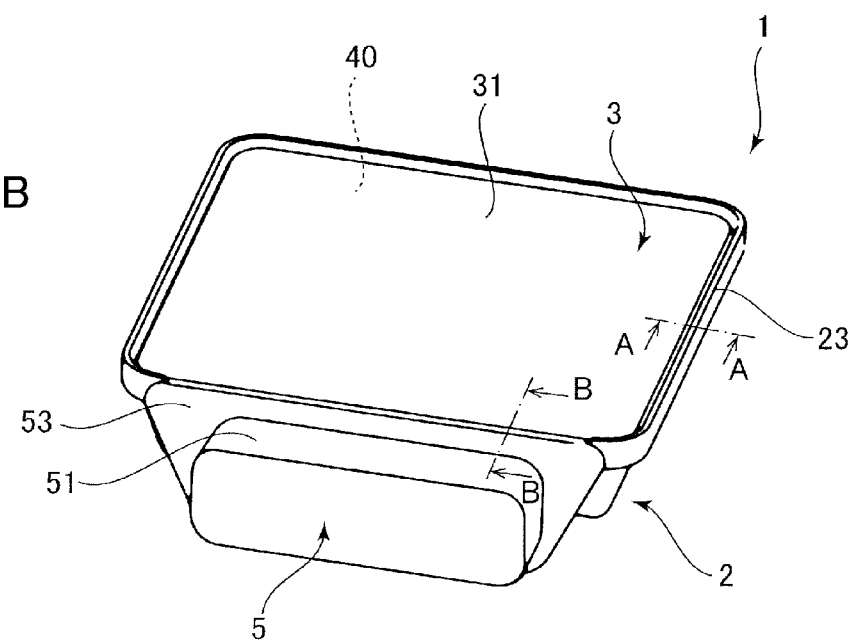

The electronic control device 1 is constituted by assembling such members. That is, the substrate 4 is disposed inside the housing 2, and the connector-side projecting streak 52a is inserted into, and joined to, the housing-side groove 24, which is formed around the side opening portion 22b, while inserting the connector 5 into the side opening portion 22b of the housing 2. Next, the cover-side projecting streak 32 is inserted into, and joined to, the housing-side groove 23, which is formed around the body opening portion 22a of the housing 2, and the connector-side groove 52b of the connector 5 such that the cover 3 covers the space 40 which is surrounded by the housing 2 and the connector 5. When joining the groove and the projecting streak, a seal material (not illustrated) is filled between the projecting streak and the groove to seal each joint portion. The seal material is a resin material such as a silicone that is fluidic, for example. After being filled, the seal material is left to stand to be solidified, thus bonding and sealing each joint portion. Consequently, as illustrated in FIG. 1B, the space 40, which is surrounded by the housing 2 and the cover 3, is tightly sealed with each joint portion sealed, and the substrate 4 is disposed in the tightly sealed space, thus obtaining the electronic control device 1 with a part of the connector 5, which is connected to the substrate 4, exposed to the outside of the space 40.

Figure 2A:
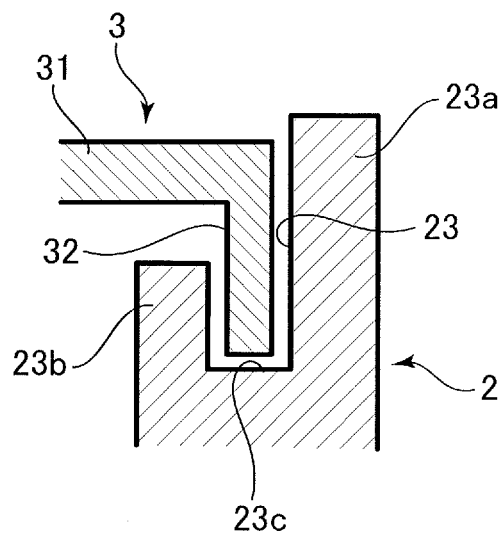
FIGS. 2A and 2B are a sectional view taken along the line A-A and the line B-B, respectively, of FIG. 1B.
Figure 2B:
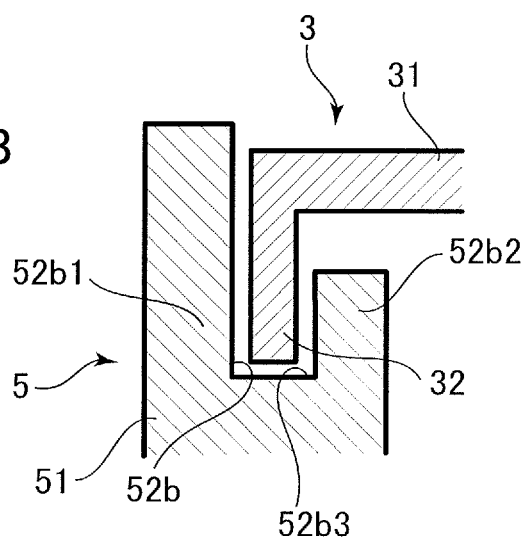

The configuration of each joint portion will be described in detail with reference to FIGS. 2 to 6. First, the joint among the cover 3, the housing 2, and the connector 5 will be described with reference to FIG. 2. FIG. 2A is a sectional view of the joint portion between the cover 3 and the housing 2. FIG. 2B is a sectional view of the joint portion between the cover 3 and the connector 5. As illustrated in FIG. 2A, the cover-side projecting streak 32, which is bent to one side from the periphery of the covering portion 31 over the entire periphery, is formed around the cover 3. On the other hand, the housing-side groove 23 is formed around the body opening portion 22a of the housing 2. The housing-side groove 23 is composed of: an outer wall portion 23a formed on the outer side of the housing 2 to serve as a housing-side outer wall portion/housing-side outer wall; an inner wall portion 23b formed closer to the space 40 than the outer wall portion 23a and extending in parallel with the outer wall portion 23a to serve as a housing-side inner wall portion/housing-side inner wall); and a bottom portion 23c that makes the outer wall portion 23a and the inner wall portion 23b continuous with each other.

To join the cover 3 and the housing 2 to each other, the cover-side projecting streak 32 is inserted between the outer wall portion 23a and the inner wall portion 23b of the housing-side groove 23. In this event, if the seal material has been filled into the housing-side groove 23, for example, the seal material is spread through the clearance between the cover-side projecting streak 32 and the housing-side groove 23 when the cover-side projecting streak 32 is inserted into the housing-side groove 23. When the seal material is left to stand in this state, the seal material is solidified so that the cover-side projecting streak 32 and the housing-side groove 23 are joined to each other. In the embodiment, the height of the outer wall portion 23a is larger than the height of the inner wall portion 23b so that the height of the cover 3 is in the range of the height of the outer wall portion 23a with the cover 3 joined to the housing 2.

As illustrated in FIG. 2B, the connector-side groove 52b is formed in a surface of the exterior portion 51 of the connector 5 on the side toward the cover 3. The connector-side groove 52b is composed of: an outer wall portion 52b1 formed on the outer side of the connector 5 to serve as a connector-side outer wall portion/connector-side outer wall; an inner wall portion 52b2 formed closer to the space 40 than the outer wall portion 52b1 and extending in parallel with the outer wall portion 52b1 to serve as a connector-side inner wall portion/connector-side inner wall; and a bottom portion 52b3 that makes the outer wall portion 52b1 and the inner wall portion 52b2 continuous with each other. To join the cover 3 and the connector 5 to each other, the cover-side projecting streak 32 is inserted between the outer wall portion 52b1 and the inner wall portion 52b2 of the connector-side groove 52b. In this event, if the seal material has been injected into the connector-side groove 52b, for example, the seal material is spread through the clearance between the cover-side projecting streak 32 and the connector-side groove 52b when the cover-side projecting streak 32 is inserted into the connector-side groove 52b. When the seal material is left to stand in this state, the seal material is solidified so that the cover-side projecting streak 32 and the connector-side groove 52b are joined to each other. In the embodiment, the height of the outer wall portion 52b1 is larger than the height of the inner wall portion 52b2 so that the height of the cover 3 is in the range of the height of the outer wall portion 52b1 with the cover 3 joined to the connector 5.

Figure 3:
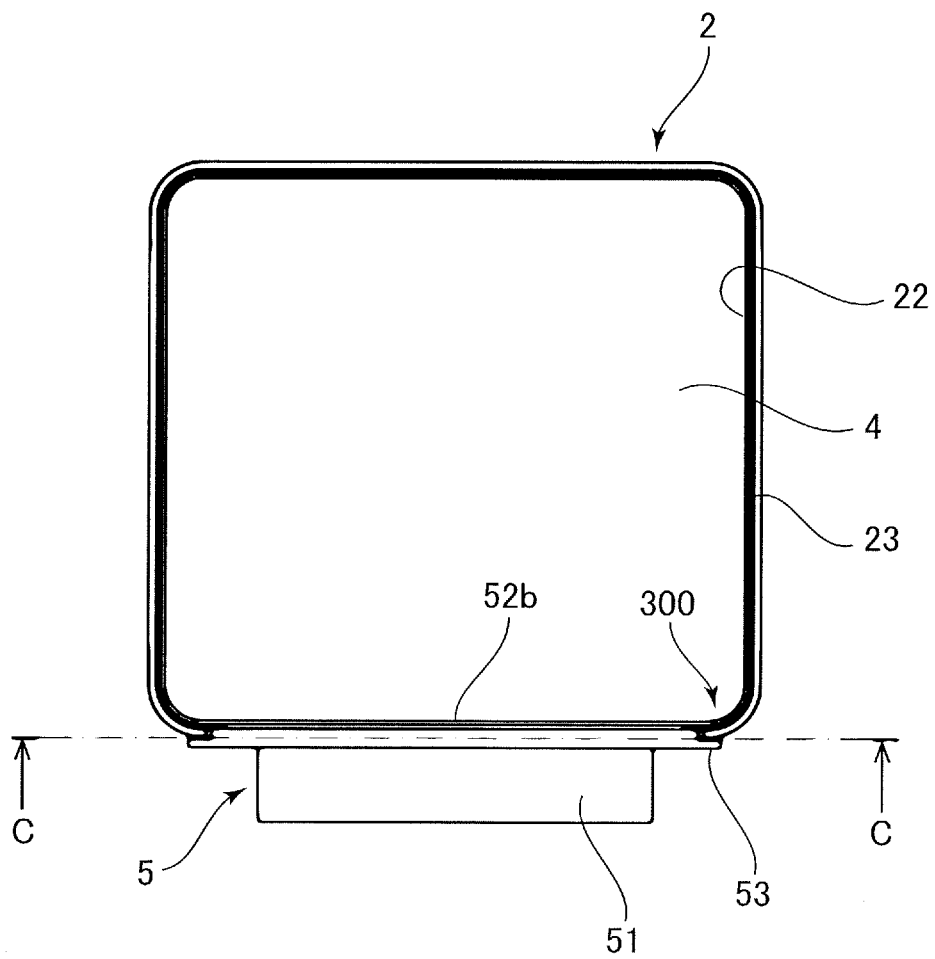
FIG. 3 is a plan view illustrating a state in which a connector is assembled to a housing of the electronic control device according to the embodiment.
Figure 4A:
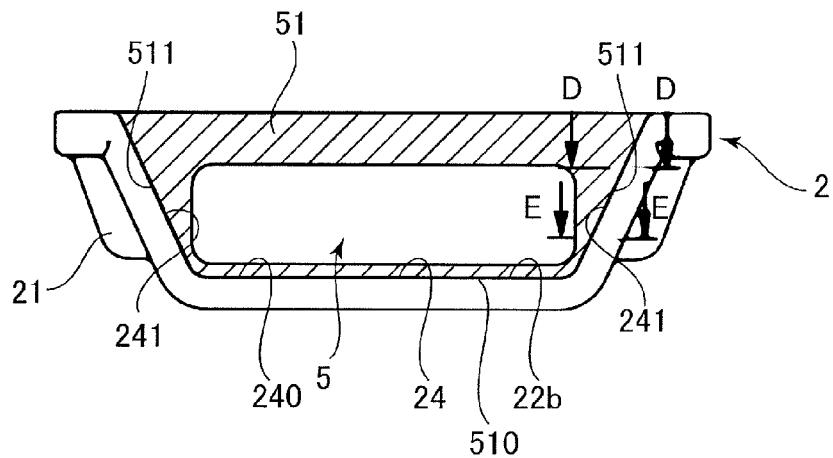
FIG. 4A is a sectional view taken along the line C-C of FIG. 3.
Figure 4B:
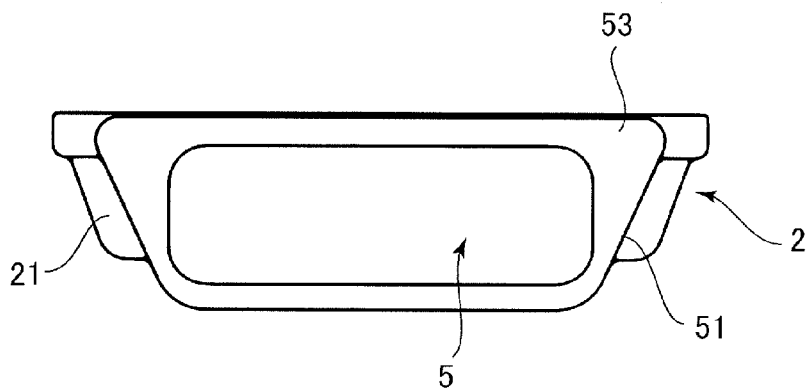
FIG. 4B is a view as seen from the lower side of FIG. 3.
Figure 4C:
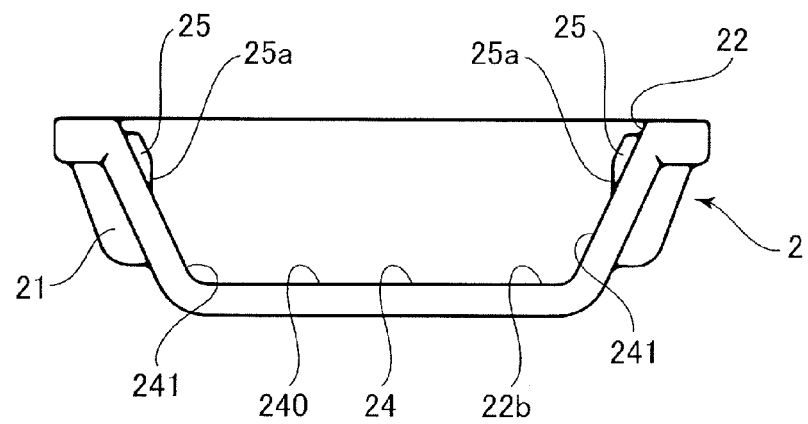
FIG. 4C is a view of only the housing as seen from the lower side of FIG. 3.
Figure 5:
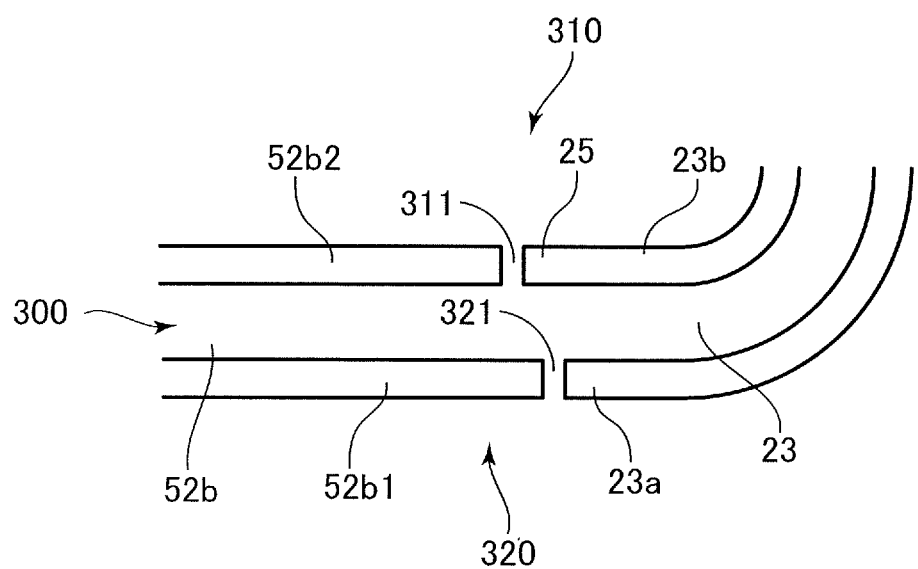
FIG. 5 is an enlarged view illustrating the lower right portion of FIG. 3 as partially omitted.

Next, the joint between the connector 5 and the housing 2 will be described with reference to FIGS. 3 to 6. As illustrated in FIGS. 3 and 4, the connector 5 is disposed so as to be inserted into the side opening portion 22b which is open in a side surface of the housing 2. In this state, the peripheral edge portion (upper end edge portion in FIG. 4) of the connector 5 on the side toward the cover 3 is at substantially the same height as, or slightly lower than, the peripheral edge portion of the housing 2 on the side toward the cover 3. That is, the outer wall portion 52b1 on the connector 5 side and the outer wall portion 23a on the housing 2 side illustrated in FIG. 2 are at substantially the same height as each other. In addition, as discussed above, the connector-side groove 52b and the housing-side groove 23 are continuous with each other to constitute the first groove 300 with the connector 5 joined to the housing 2. At this time, as illustrated in FIG. 5, a first inner wall portion 310 (first inner wall) is constituted by the inner wall portion 23b of the housing 2 and the inner wall portion 52b2 of the connector 5. In addition, a first outer wall portion 320 (first outer wall) is constituted by the outer wall portion 23a of the housing 2 and the outer wall portion 52b1 of the connector 5.

As illustrated in FIG. 6, the connector 5 and the housing 2 are joined to each other by inserting the connector-side projecting streak 52a into the housing-side groove 24. In the embodiment, the relationship between an outer wall portion 24a and an inner wall portion 24b that constitute the housing-side groove 24 is different depending on the position of the joint portion. Specifically, as illustrated in FIGS. 1A, 4C, 5, and 6, the inner wall portion 24b partially has a projecting portion 25 that projects in the direction of the height of the inner wall portion 24b. Such a feature will be described in detail with reference to FIGS. 4 to 6.

Figure 6A:
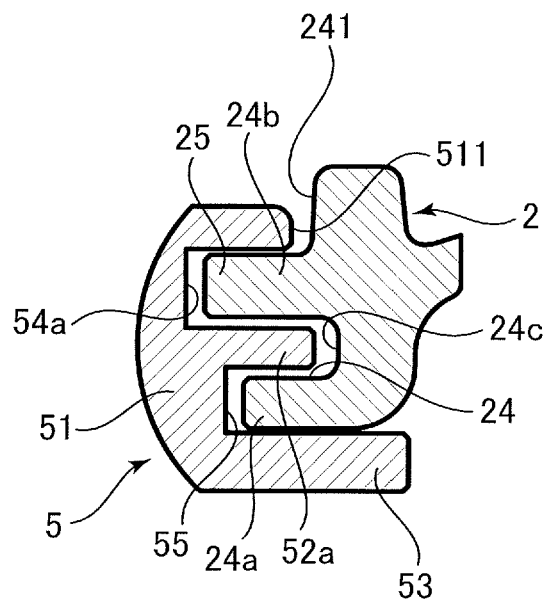
FIGS. 6A and 6B are a sectional view taken along the line D-D and the line E-E, respectively, of FIG. 4A.
Figure 6B:
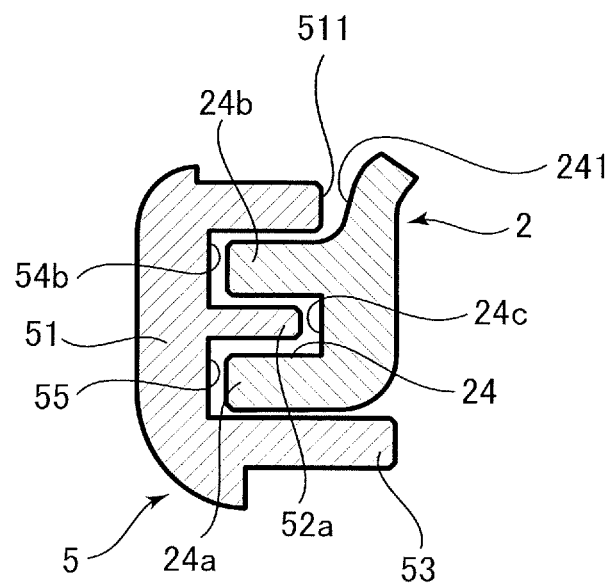

FIG. 6A is a sectional view of the joint portion between the connector 5 and the housing 2 on the side toward the cover 3. FIG. 6B is a sectional view of the joint portion between the connector 5 and the housing 2 on the side away from the cover 3. As illustrated in FIGS. 4A and 4C, the housing-side groove 24 (second groove) is formed in a bottom portion 240 of the side opening portion 22b, which is positioned on the opposite side of the body opening portion 22a, and a pair of side portions 241, which are inclined in directions away from each other as the side portions 241 extend from the bottom portion 240 toward the body opening portion 22a, the bottom portion 240 and the side portions 241 forming the periphery of the side opening portion 22b of the housing 2. As illustrated in FIG. 6, the housing-side groove 24 is composed of: the outer wall portion 24a which is formed on the outer side and is continuous with the outer wall portion 23a of the first groove 300 to serve as a second outer wall portion; the inner wall portion 24b which is formed on the side closer to the space 40 side than the outer wall portion 24a, extends in parallel with the outer wall portion 24a and is continuous with the inner wall portion 23b of the first groove 300 to serve as a second inner wall portion; and a bottom portion 24c that makes the outer wall portion 24a and the inner wall portion 24b continuous with each other.

Figure 7:
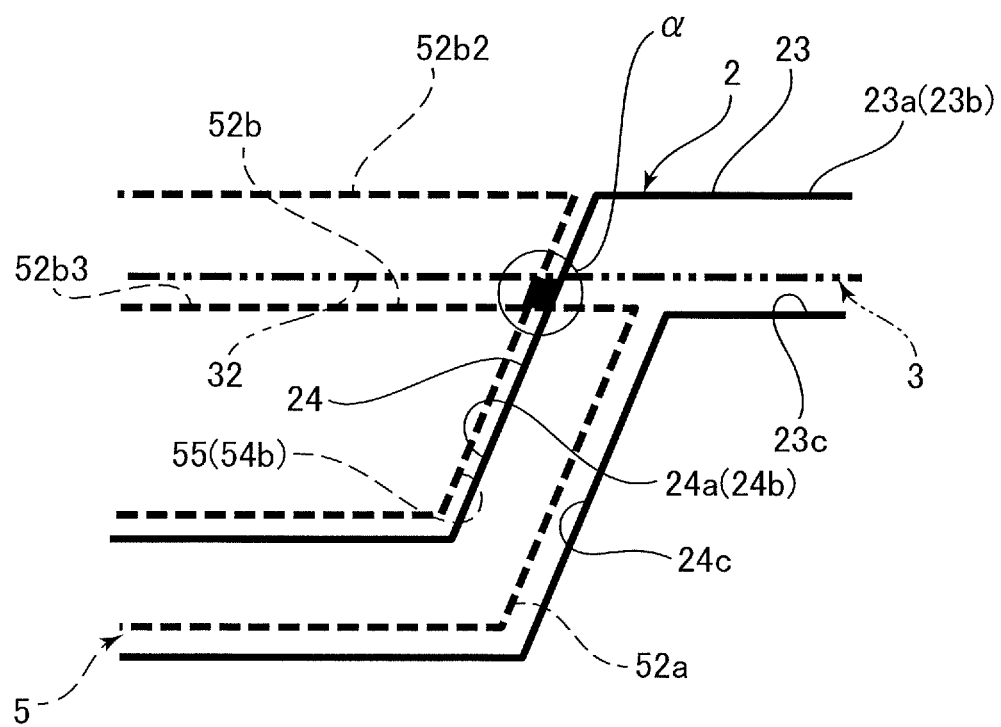
FIG. 7 is a schematic view illustrating the relationship of each joint portion among a housing, a cover, and a connector according to a comparative example.

As illustrated in FIG. 6A, the inner wall portion 24b which constitutes the housing-side groove 24 of the housing 2 partially has the projecting portion 25, the height of which is larger than the height of the outer wall portion 24a. In other words, a part (projecting portion 25) of the inner wall portion 24b is formed to be displaced with respect to the outer wall portion 24a as seen in the width direction of the housing-side groove 24 (up-down direction of FIG. 6). Except for a portion of the housing-side groove 24 in which the projecting portion 25 is formed, as illustrated in FIG. 6B, the height of the outer wall portion 24a and the height of the inner wall portion 24b are substantially the same as each other (the outer wall portion 24a and the inner wall portion 24b have an equal height). In addition, as discussed above, the outer wall portion 24a is continuous with the outer wall portion 23a of the housing-side groove 23, which is formed around the body opening portion 22a of the housing 2, and the inner wall portion 24b is similarly continuous with the inner wall portion 23b of the housing-side groove 23. That is, the housing-side groove 23 and the housing-side groove 24 are continuous with each other. As illustrated in FIG. 5, a projecting portion 25 is also formed on the inner wall portion 23b of the housing-side groove 23. Thus, the inner wall portion 23b also has a projecting portion 25, the height of which in the extension direction of the first groove 300 (direction along the first groove 300; left-right direction in FIG. 5) is larger than the height of the outer wall portion 23a. In addition, as illustrated in FIG. 7 to be discussed later, a part of the cover-side projecting streak 32 of the cover 3 is inserted into the housing-side groove 24 to be also joined to the housing-side groove 24. Since the housing-side groove 24 is formed integrally and continuously with the housing-side groove 23, a seal achieved by the joint between the cover 3 and the housing 2 is also formed continuously without interruption.

On the other hand, the connector-side projecting streak 52a is formed on a peripheral surface of the exterior portion 51 of the connector 5 facing the housing-side groove 24 and projects over the entire peripheral surface. As illustrated in FIG. 4A, the peripheral surface of the exterior portion 51 is composed of a bottom surface 510 and a pair of side surfaces 511 inclined in directions away from each other as the side surfaces 511 extend from both ends of the bottom surface 510. The bottom surface 510 faces the bottom portion 240. The side surfaces 511 face the side portions 241. The connector-side projecting streak 52a is formed to project so as to extend from the side surfaces 511 to the bottom surface 510. The amount of projection of the connector-side projecting streak 52a from the side surfaces 511 is substantially the same along the inclination direction of the side surfaces 511. Thus, the peripheral edge portion of a portion of the connector-side projecting streak 52a formed on the side surfaces 511 is substantially parallel with the side surfaces 511. As discussed above, the connector-side groove 52b is formed in a surface of the exterior portion 51 on the side toward the cover 3. The connector-side projecting streak 52a is formed to be continuous with the connector-side groove 52b.

In addition, inside grooves 54a and 54b are formed in the side surfaces 511 of the exterior portion 51 on the side closer to the space 40 (inner side) than the connector-side projecting streak 52a. The inside grooves 54a and 54b are formed continuously to be recessed from the side surfaces 511 discussed above. That is, the side surfaces 511 and the connector-side projecting streaks 52a which are formed in the side surfaces 511 are inclined in directions away from each other as the pair of side surfaces 511 and connector-side projecting streaks 52a extend away from the bottom surface 510 as discussed above. As illustrated in FIG. 6A, the inside groove 54a which faces the projecting portion 25 of the inner wall portion 24b at a portion away from the bottom surface 510 is deeply recessed from the side surfaces 511 to allow insertion of the projecting portion 25. As illustrated in FIG. 6B, on the other hand, the inside groove 54b which is formed on the side closer to the bottom surface 510 than the inside groove 54a is shallowly recessed from the side surfaces 511.

The inside grooves 54a and 54b are formed to enable passage of the projecting portion 25 of the inner wall portion 24b when the connector 5 is inserted into the side opening portion 22b from the body opening portion 22a side. In particular, the inside groove 54b, which is positioned on the distal end side in the insertion direction, is inclined in such a direction that the inside grooves 54b which are formed in the pair of side surfaces 511 are brought closer to each other as the inside grooves 54b extend toward the distal end side so that the inside groove 54b does not interfere with the projecting portion 25 during insertion of the connector 5. In addition, as illustrated in FIG. 4C, the projecting portion 25 serves as a guide portion 25a in which a portion, on the bottom portion 240 side, of the peripheral edge portion which faces the inside groove 54a is formed to extend in parallel with the insertion direction of the connector 5 so that the connector 5 can be inserted smoothly with the guide portion 25a guiding the inside groove 54a during insertion of the connector 5. With the connector 5 mounted to the housing 2, the projecting portion 25 is inserted into the inside groove 54a, and a portion of the inner wall portion 24b on the side closer to the bottom portion 240 than the projecting portion 25 is inserted into the inside groove 54b. That is, a bottom surface of the inside grooves 54a and 54b is shaped along the shape of the peripheral edge portion of the inner wall portion 24b which includes the projecting portion 25.

In addition, an outside groove 55 that is recessed from the bottom surface 510 and the side surfaces 511 of the exterior portion 51 is formed between the connector-side projecting streak 52a and the outside wall portion 53 of the bottom surface 510 and the side surfaces 511. A bottom surface of the outside groove 55 is shaped along the shape of the bottom surface 510 and the side surfaces 511. The outer wall portion 24a is inserted into the outside groove 55 with the connector 5 mounted to the housing 2. In addition, the inside groove 54a is continuous with the inner wall portion 52b2 of the connector-side groove 52b, and the outside groove 55 is continuous with the outer wall portion 52b1 of the connector-side groove 52b. As illustrated in FIG. 5, the height of the inner wall portion 52b2 is smaller than the height of the outer wall portion 52b1.

To join the connector 5 and the housing 2 to each other, the connector-side projecting streak 52a is inserted between the outer wall portion 24a and the inner wall portion 24b of the housing-side groove 24. In addition, the outer wall portion 24a is inserted into the outside groove 55, a portion of the inner wall portion 24b that has the projecting portion 25 is inserted into the inside groove 54a, and a portion of the inner wall portion 24b that does not have the projecting portion 25 is inserted into the inside groove 54b. In this event, if the seal material has been filled into the housing-side groove 24, for example, the seal material is spread through the clearance between the connector-side projecting streak 52a and the housing-side groove 24 when the connector-side projecting streak 52a is inserted into the housing-side groove 24. In the embodiment, the amount of the seal material is set such that at least the clearance between the peripheral edge of the outer wall portion 24a and the bottom portion of the outside groove 55 is filled with the seal material. Preferably, the clearance between the peripheral edge of the inner wall portion 24b which includes the projecting portion 25 and the bottom portion of the inside grooves 54a and 54b is also filled with the seal material. When the seal material is left to stand in this state, the seal material is solidified so that the connector-side projecting streak 52a and the housing-side groove 24 are joined to each other.

In this state, the connector-side groove 52b and the housing-side groove 23 are made continuous with each other to constitute the first groove 300. As illustrated in FIG. 5, the inner wall portion 23b of the housing 2 and the inner wall portion 52b2 of the connector 5 face each other via a clearance 311 in the direction in which the first groove 300 extends, and the outer wall portion 23a of the housing 2 and the outer wall portion 52b1 of the connector 5 face each other via a clearance 321 in the direction in which the first groove 300 extends. At this time, the clearance 311 and the clearance 321 differ from each other in position in the extension direction of the first groove 300. In other words, the connector-side groove 52b and the housing-side groove 23 are formed such that the clearance 311 and the clearance 321 are displaced from each other as seen in the width direction of the first groove 300 (up-down direction in FIG. 5).

Here, a comparative example in which the projecting portion 25 is not formed on the inner wall portion 24b unlike the configuration discussed above will be described with reference to FIG. 7. The comparative example has the same configuration as that discussed above except that the projecting portion 25 is not formed, and the same components are given the same reference numerals. FIG. 7 schematically illustrates the relationship of each joint portion at an intersecting portion/intersection at which the housing-side grooves 23 and 24 of the housing 2, the cover-side projecting streak 32 of the cover 3, and the connector-side projecting streak 52a and the connector-side groove 52b of the connector 5 intersect each other. In FIG. 7, the solid line indicates the configuration of the housing 2, the broken line indicates the configuration of the connector 5, and the dash-double-dot line indicates the configuration of the cover 3. This also applies to FIG. 8 to be discussed later.

In the case of the comparative example, at an encircled portion α in FIG. 7 at which the housing-side grooves 23 and 24 (solid line), the cover-side projecting streak 32 (dash-double-dot line), and the connector-side projecting streak 52a and the connector-side groove 52b (broken line) intersect each other, the joint is achieved by only the seal material. That is, at the portion α at which the inner wall portion 24b of the housing-side groove 24 which serves as the second groove, an end surface of the outer wall portion 24a, and a plane that includes bottom surfaces of the housing-side groove 23 and the connector-side groove 52b which constitute the first groove intersect each other, the joint is achieved by only the seal material. More specifically, when seen in the width direction of the housing-side grooves 23 and 24 (front-back direction of the sheet surface of FIG. 7), none of the housing-side grooves 23 and 24, the cover-side projecting streak 32 of the cover 3, and the connector-side projecting streak 52a and the connector-side groove 52b is present, but only the seal material is present, at the portion α between the outer wall portion 24a and the inner wall portion 24b of the housing-side groove 24 and the groove 55 and the inside groove 54b of the connector 5, and between the cover-side projecting streak 32 and the connector-side groove 52b.

This is because the connector 5 has the connector-side projecting streak 52a which is connected to the housing-side groove 24 of the housing 2 and the connector-side groove 52b which is joined to the cover-side projecting streak 32 of the cover 3, and therefore there is a transition portion between the connector-side projecting streak 52a and the connector-side groove 52b on the peripheral surface of the exterior portion 51 of the connector 5. At the transition portion, neither of the connector-side projecting streak 52a and the connector-side groove 52b is present, and therefore there is inevitably a location at which a projecting streak is not inserted into a groove at the transition portion in the case where three members, namely the housing 2, the cover 3, and the connector 5, are joined to each other by inserting a projecting streak into a groove. That is, there is a location at which there is no groove or projecting streak when seen in the width direction of the groove, and the three members are joined to each other by only the seal material at the location. The joint portion α formed by only the seal material is low in rigidity as a seal compared to other portions, and therefore tends to be low in sealing performance.

Figure 8:
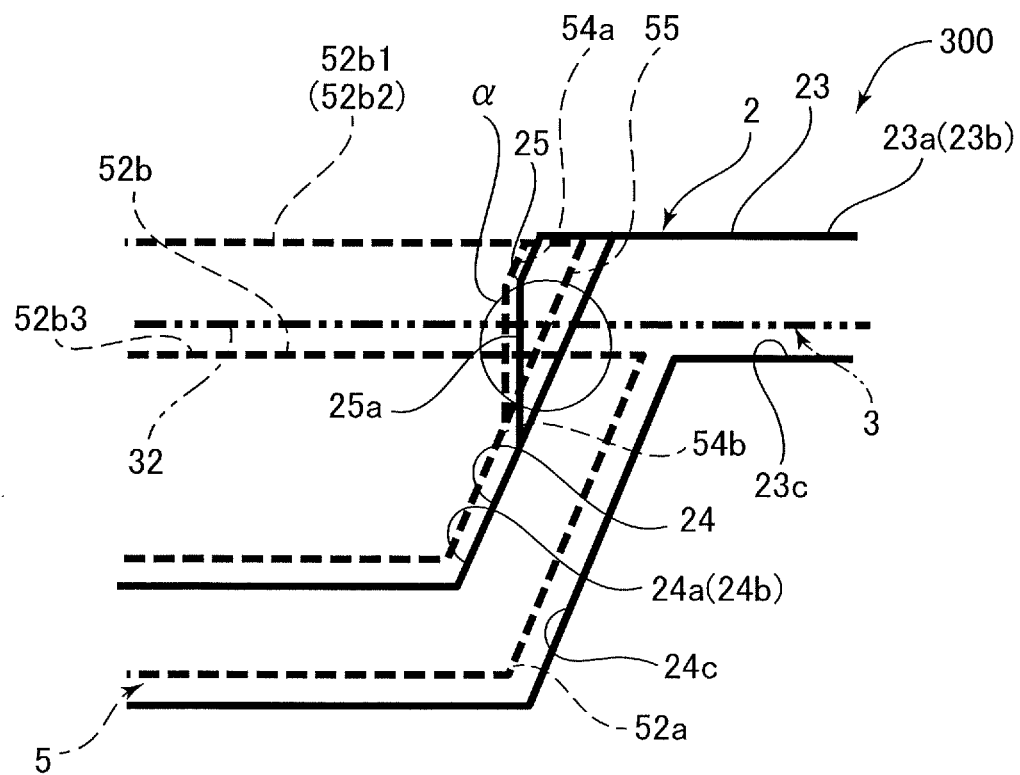
FIG. 8 is a schematic view illustrating the relationship of each joint portion among a housing, a cover, and a connector according to the embodiment.

In the case of the embodiment, in contrast, as illustrated in FIG. 8, the projecting portion 25 discussed above is positioned in the portion α. That is, the inner wall portion 24b which constitutes the housing-side groove 24 and the inner wall portion 23b which constitutes the housing-side groove 23 partially project to the transition portion between the connector-side projecting streak 52a and the connector-side groove 52b. The clearance 311 between the inner wall portion 23b of the housing 2 and the inner wall portion 52b2 of the connector 5 and the clearance 321 between the outer wall portion 23a of the housing 2 and the outer wall portion 52b1 of the connector 5 differ from each other in position in the extension direction of the first groove 300. In other words, at an intersecting portion at which the end surface of the outer wall portion 24a, which is one wall portion/one wall of the inner wall portion 24b and the outer wall portion 24a of the housing-side groove 24, and a plane that includes the bottom surfaces of the housing-side groove 23 and the connector-side groove 52b intersect each other, the height of the inner wall portion 24b, which is the other wall portion/other wall, is larger than the height of the outer wall portion 24a. Put further differently, the inner wall portion 24b is formed to be displaced with respect to the outer wall portion 24a so as to overlap the intersecting portion α discussed above as seen in the width direction of the housing-side grooves 23 and 24 (front-back direction of the sheet surface of FIG. 8). Here, in a region that extends from the intersecting portion to an end portion of the cover-side projecting streak 32 of the cover 3, the height of the inner wall portion 24b is larger than the height of the outer wall portion 24a. In addition, the distance from the end surface of the outer wall portion 24a to the bottom surface of the groove 55 of the connector 5, which is a surface of the connector 5 that faces the end surface of the outer wall portion 24a, is smaller than the difference in height between the outer wall portion 24a and the inner wall portion 24b.

Figure 9A:
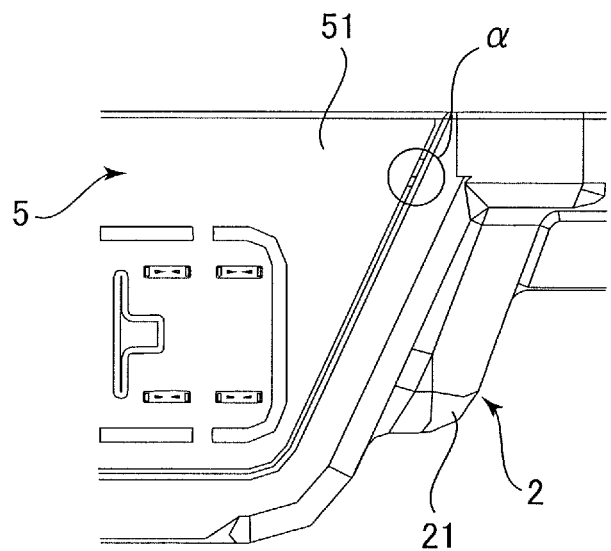
FIG. 9A is an enlarged view of the right end portion of FIG. 4A.
Figure 9B:
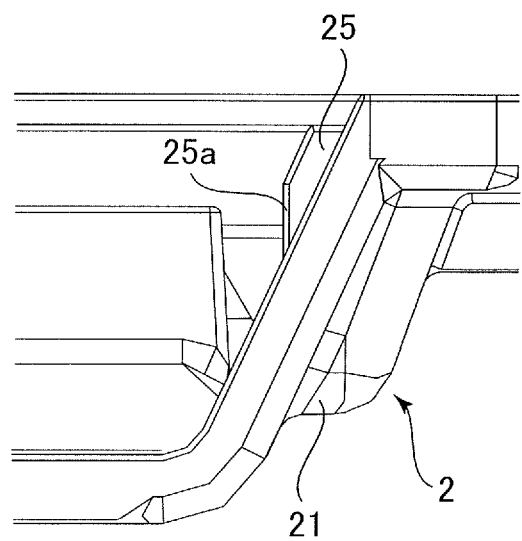
FIG. 9B is an enlarged view of the right end portion of FIG. 4C.

A specific example is illustrated in FIG. 9. An encircled portion α in FIG. 9A is assumed to be the intersecting portion discussed above. Then, as illustrated in FIG. 9B, the projecting portion 25 is formed at a part of the inner wall portion 24b of the housing-side groove 24 of the housing 2 and the inner wall portion 23b which constitutes the housing-side groove 23 such that the intersecting portion α and the projecting portion 25 overlap each other as seen in the width direction. The shape of the projecting portion 25 is generally trapezoidal in FIG. 9. However, the shape of the projecting portion 25 may be a different shape such as a triangular shape and a semi-circular shape as long as the projecting portion 25 is formed to overlap the intersecting portion discussed above. It should be noted, however, that the relationship in shape between the projecting portion 25 and the inside grooves 54a and 54b is prescribed such that, when inserting the connector 5 into the side opening portion 22b from the body opening portion 22a side, the projecting portion 25 can pass through the inside grooves 54a and 54b, the projecting portion 25 can be inserted into the inside groove 54a, and a portion of the inner wall portion 24b that does not have the projecting portion 25 can be inserted into the inside groove 54b.

In the case of the thus configured embodiment, the clearance 311 between the inner wall portion 23b of the housing 2 and the inner wall portion 52b2 of the connector 5 and the clearance 321 between the outer wall portion 23a of the housing 2 and the outer wall portion 52b1 of the connector 5 differ from each other in position in the extension direction of the first groove 300. In addition, at an intersecting portion at which the end surface of the outer wall portion 24a of the housing-side groove 24 and the plane that includes the bottom surfaces of the housing-side groove 23 and the connector-side groove 52b intersect each other, the height of the inner wall portion 24b is larger than the height of the outer wall portion 24a. That is, the inner wall portion 24b is formed with the projecting portion 25 to make the height of the inner wall portion 24b larger than the height of the outer wall portion 24a so that the inner wall portion 24b overlaps the intersecting portion α discussed above. Therefore, a joint portion formed by only the seal material can be eliminated. In addition, the height of the inner wall portion 24b is larger than the height of the outer wall portion 24a. Therefore, the structure can be made compact with the dimension in the width direction of the groove not increased as in the structure described in Japanese Patent Application Publication No. 2013-69735 discussed earlier. As a result, the rigidity of the seal can be enhanced in each joint portion among the housing 2, the cover 3, and the connector 5, thus obtaining the electronic control device 1 with high sealing performance.

In the electronic control device (1) according to the present disclosure, in addition, the first joint portion of the housing is the second groove (housing-side groove 24) which has the second inner wall portion (inner wall portion 24*b*) that is formed on the side of the space and that is continuous with the housing-side inner wall portion (inner wall portion 23*b*), and the second outer wall portion (outer wall portion 24*a*) that is formed on the outer side and that is continuous with the housing-side outer wall portion (outer wall portion 23*a*); the second joint portion is the second projecting streak (connector-side projecting streak 52*a*); and at an intersecting portion at which an end surface of one wall portion of the second inner wall portion (inner wall portion 24*b*) and the second outer wall portion (outer wall portion 24*a*) and a plane that includes a bottom surface of the first groove (300) intersect each other, a height of the other wall portion is larger than a height of the one wall portion.

Therefore, a joint portion formed by only the seal material can be eliminated. In addition, the first groove (housing-side groove 23) of the second opening portion (body opening portion 22*a*) and the second groove (housing-side groove 24) of the first opening portion (side opening portion 22*b*) of the housing (2) can be formed to be continuous with each other, which can further simplify the configuration of the housing (2). For example, if the housing (2) is formed by casting, the grooves can be formed easily, and the housing (2) which requires heat radiation performance can be easily formed into a shape that meets such a requirement, e.g. a shape with heat radiation fins. On the other hand, if the connector (5) is formed from a synthetic resin, the connector (5) can be easily configured such that the first groove (connector-side groove 52*b*) and the second projecting streak (connector-side projecting streak 52*a*) are continuous with each other.

In the embodiment, the cover 3 is formed by pressing, and the housing 2 is formed by casting. However, the cover 3 may be formed by casting, the housing 2 may be formed by pressing, or both the cover 3 and the housing 2 may be formed by casting or pressing. In addition, at least one of the cover 3 and the housing 2 may be formed from a heat-resistant synthetic resin.

In the electronic control device (1) according to the present disclosure, in addition, in a region that extends from the intersecting portion to an end portion of the first projecting streak (cover-side projecting streak 32) of the cover (3), the height of the other wall portion (inner wall portion 24*b*) is larger than the height of the one wall portion (outer wall portion 24*a*). Therefore, a joint portion formed by only the seal material can be eliminated more reliably.

In the electronic control device (1) according to the present disclosure, in addition, a distance from the end surface of the one wall portion (outer wall portion 24*a*) to a surface (bottom surface of the groove 55 of the connector 5) that faces the end surface of the one wall portion (outer wall portion 24*a*), of one joint portion (connector-side projecting streak 52*a*) of the first joint portion (housing-side groove 24) and the second joint portion (connector-side projecting streak 52*a*) that includes the second projecting streak is smaller than a difference in height between the one wall portion (outer wall portion 24*a*) and the other wall portion (inner wall portion 24*b*). Therefore, a joint portion formed by only the seal material can be eliminated more reliably.

In the electronic control device (1) according to the present disclosure, in addition, a height of the inner wall portion (24*b*) of the second groove (housing-side groove 24) is larger than a height of the outer wall portion (24*a*) of the second groove.

Therefore, the seal performance of the joint portion on the outer side, which is on the side opposite to the space (40), can be secured easily. That is, in the case where the height of the outer wall portion (24*a*) is larger, the seal material which has been filled into the clearance between the second groove (housing-side groove 24) and the second projecting streak (connector-side projecting streak 52*a*) may not be easily spread to the distal end side of the outer wall portion (24*a*). If the height of the inner wall portion (24*b*) is larger, however, the seal material can be easily spread to the distal end side of the outer wall portion (24*a*).

Here, in the case where the electronic control device (1) is mounted on a vehicle, water (in particular, salt water) may adhere to the electronic control device (1). In this case, if the salt water climbs over the outer wall portion (24*a*) to enter the second groove (housing-side groove 24), corrosion may be caused in the second groove (housing-side groove 24). Therefore, it is required that entry of the salt water should be prevented on the outer side as much as possible. If the height of the inner wall portion (24*b*) is larger as in the electronic control device (1) according to the present disclosure, however, the seal material can be easily spread to the distal end side of the outer wall portion (24*a*), which can prevent entry of foreign matter such as salt water on the outer side as much as possible to improve the durability of the device.

In the electronic control device (1) according to the present disclosure, in addition, the inner wall portion (24*b*) of the second groove (housing-side groove 24) partially has a projecting portion (25) that projects, at the intersecting portion ($\alpha$), to a height that is larger than the height of the outer wall portion (24*a*) of the second groove (housing-side groove 24), the inner wall portion (24*b*) of the second groove (housing-side groove 24) excluding the projecting portion (25) being equal in height to the outer wall portion (24*a*). Therefore, the amount of the material can be reduced compared to a case where the height of the entire inner wall portion (24*b*) is increased, which can lower the cost of the device.

In the embodiment, the height of the inner wall portion 24*b* of the housing-side groove 24 is larger than the height of the outer wall portion 24*a*. However, the height of the outer wall portion 24*a* may be larger than the height of the inner wall portion 24*b*. In short, it is only necessary that, at an intersecting portion at which an end surface of one wall portion of the inner wall portion 24*b*, on the side of the space, and the outer wall portion 24*a*, on the outer side, of the housing-side groove 24 and a plane that includes the bottom surface of the first groove intersect each other, the height of the other wall portion should be larger than the height of the one wall portion. Similarly, the height of the outer wall portion 23*a* of the housing-side groove 23 may be larger than the height of the inner wall portion 23*b*. In short, it is only necessary that the clearance 311 between the inner wall portion 23*b* of the housing 2 and the inner wall portion 52*b*2 of the connector 5 and the clearance 321 between the outer wall portion 23*a* of the housing 2 and the outer wall portion 52*b*1 of the connector 5 should differ from each other in position in the extension direction of the first groove 300.

Other Embodiments

In the embodiment discussed above, the first joint portion which is formed in the housing 2 is a groove. However, the second joint portion which is formed in the connector 5 may be a groove, and the first joint portion may be a projecting streak. In this case, the height of the other wall portion of the inner wall portion and the outer wall portion of the groove as the second joint portion is larger than the height of the one wall portion in the intersection portion discussed above.

Figure 10A:
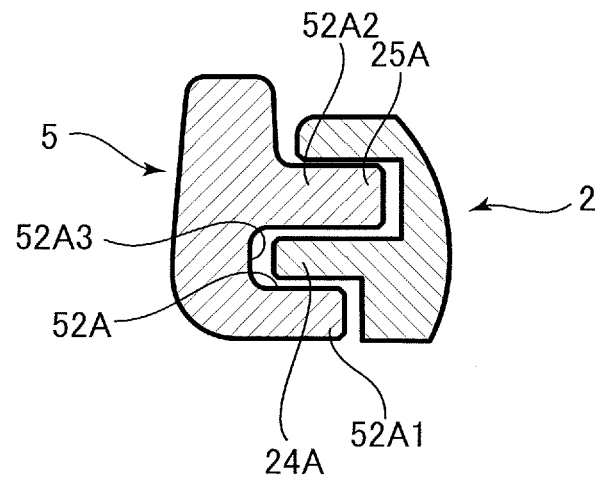
FIG. 10 illustrates an electronic control device according to a different embodiment, in which FIG. 10A corresponds to the D-D section of FIG. 4A and FIG. 10B corresponds to the E-E section of FIG. 4A.
Figure 10B:
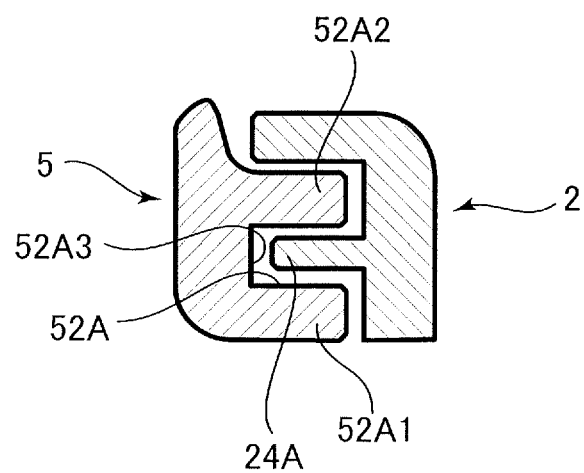

A specific description will be made with reference to FIG. 10. Components that are similar to those of the embodiment discussed above are given the same reference numerals to omit description. FIG. 10A is a sectional view of the joint portion between the connector 5 and the housing 2 on the side toward the cover 3. FIG. 10B is a sectional view of the joint portion between the connector 5 and the housing 2 on the side away from the cover 3. A housing-side projecting streak 24A that serves as the first joint portion (second projecting streak) is formed around the side opening portion 22b of the housing 2. The housing-side projecting streak 24A is continuous with the housing-side groove 23. On the other hand, a connector-side groove 52A that serves as a second joint portion (second groove) is formed at a position facing the side opening portion 22b around the exterior portion 51 of the connector 5. The connector-side groove 52A is continuous with the connector-side groove 52b.

The connector-side groove 52A is composed of: an outer wall portion 52A1 formed on the outer side and being continuous with the outer wall portion 52b1 of the connector-side groove 52b to serve as a second outer wall portion; an inner wall portion 52A2 formed closer to the space 40 than the outer wall portion 52A1, extending substantially in parallel with the outer wall portion 52A1 and being continuous with the inner wall portion 52b2 of the connector-side groove 52b to serve as a second inner wall portion; and a bottom portion 52A3 that makes the outer wall portion 52A1 and the inner wall portion 52A2 continuous with each other. To join the connector 5 and the housing 2 to each other, the housing-side projecting streak 24A is inserted between the outer wall portion 52A1 and the inner wall portion 52A2 of the connector-side groove 52A.

As illustrated in FIG. 10A, the inner wall portion 52A2 partially has a projecting portion 25A, the height of which is larger than the height of the outer wall portion 52A1. In other words, a part (projecting portion 25A) of the inner wall portion 52A2 is formed to be displaced with respect to the outer wall portion 52A1 as seen in the width direction of the connector-side groove 52A (up-down direction of FIG. 10). Except for a portion of the connector-side groove 52A in which the projecting portion 25A is formed, as illustrated in FIG. 10B, the height of the outer wall portion 52A1 and the height of the inner wall portion 52A2 are substantially the same as each other (the outer wall portion 52A1 and the inner wall portion 52A2 have an equal height). In addition, the projecting portion 25A is formed to extend to the inner wall portion 52b2 of the connector 5.

In the different embodiment, a part of the inner wall portion 52A2 which constitutes the connector-side groove 52A is projected at a transition portion between the housing-side groove 23 and the housing-side projecting streak 24A. In other words, at an intersecting portion at which an end surface of the outer wall portion 52A1, which is one wall portion of the inner wall portion 52A2 and the outer wall portion 52A1 of the housing-side groove 52A, and a plane that includes the bottom surfaces of the housing-side groove 23 and the connector-side groove 52b intersect each other, the height of the inner wall portion 52A, which is the other wall portion, is larger than the height of the outer wall portion 24a.

Also in the case of the different embodiment, the clearance 311 between the inner wall portion 23b of the housing 2 and the inner wall portion 52b2 of the connector 5 and the clearance 321 between the outer wall portion 23a of the housing 2 and the outer wall portion 52b1 of the connector 5 differ from each other in position in the extension direction of the first groove 300. It should be noted, however, that for this embodiment, in FIG. 5 discussed earlier, the height of the inner wall portion 52b2, on which the projecting portion 25A is formed, is larger than the height of the outer wall portion 52b1. Thus, the clearance 311 is displaced to the right from the position in FIG. 5 with respect to the clearance 321. Also in the case of such a different embodiment, as in the embodiment discussed above, a joint portion formed by only the seal material can be eliminated.

INDUSTRIAL APPLICABILITY

The electronic control device can be used for vehicles such as passenger cars and trucks.

The invention claimed is:

1. An electronic control device comprising:
    a housing having a first opening and a second opening;
    a cover; and
    a connector electrically connected to a substrate disposed inside the housing, wherein:
        a first joint of the housing and a second joint of the connector are joined to each other in the first opening;
        a first groove that is constituted by a housing-side groove and a connector-side groove is formed around the second opening and in a surface of the connector on a side toward the cover, a first projecting streak provided at a peripheral edge of the cover is inserted into the first groove, and the cover is joined to the housing and the connector so as to cover a space surrounded by the housing and the connector;
        the first groove has a first inner wall composed of a housing-side inner wall formed on the housing on a side of the space and a connector-side inner wall formed on the connector on the side of the space, and a first outer wall composed of a housing-side outer wall formed on the housing on an outer side and a connector-side outer wall formed on the connector on the outer side; and
        a first clearance on the cover side between the housing-side inner wall and the connector-side inner wall and a second clearance on the cover side between the housing-side outer wall and the connector-side outer wall are disposed so as to be displaced from each other as seen in the width direction of the connector-side groove.

2. The electronic control device according to claim 1, wherein:
    the first joint of the housing is a second groove which has a second inner wall that is formed on the side of the space and that is continuous with the housing-side inner wall, and a second outer wall that is formed on the outer side and that is continuous with the housing-side outer wall;
    the second joint is a second projecting streak; and
    at an intersection at which an end surface of one wall of the second inner wall and the second outer wall and a plane that includes a bottom surface of the first groove intersect each other, a height of the other wall is larger than a height of the one wall.

3. The electronic control device according to claim 2, wherein
in a region that extends from the intersection to an end of the first projecting streak of the cover, the height of the other wall is larger than the height of the one wall.

4. The electronic control device according to claim 2, wherein
a distance from the end surface of the one wall to a surface that faces the end surface of the one wall, of one joint of the first joint and the second joint that includes the second projecting streak is smaller than a difference in height between the one wall and the other wall.

5. The electronic control device according to claim 2, wherein
a height of the inner wall of the second groove is larger than a height of the outer wall of the second groove.

6. The electronic control device according to claim 5, wherein
the inner wall of the second groove partially has a projection that projects, at the intersection, to a height that is larger than the height of the outer wall of the second groove, the inner wall of the second groove excluding the projection being equal in height to the outer wall.

7. The electronic control device according to claim 1, wherein:
the second joint of the connector is a second groove which has a second inner wall that is formed on the side of the space and that is continuous with the connector-side inner wall, and a second outer wall that is formed on the outer side and that is continuous with the connector-side outer wall;
the first joint is a second projecting streak; and
at an intersection at which an end surface of one wall of the second inner wall and the second outer wall and a plane that includes a bottom surface of the first groove intersect each other, a height of the other wall is larger than a height of the one wall.

8. The electronic control device according to claim 7, wherein
in a region that extends from the intersection to an end of the first projecting streak of the cover, the height of the other wall is larger than the height of the one wall.

9. The electronic control device according to claim 7, wherein
a distance from the end surface of the one wall to a surface that faces the end surface of the one wall, of one joint of the first joint and the second joint that includes the second projecting streak is smaller than a difference in height between the one wall and the other wall.

10. The electronic control device according to claim 7, wherein
a height of the inner wall of the second groove is larger than a height of the outer wall of the second groove.

* * * * *